(12) United States Patent
Lafort

(10) Patent No.: US 7,149,317 B2
(45) Date of Patent: Dec. 12, 2006

(54) CMOS HIGH IMPEDANCE CIRCUIT

(75) Inventor: Adrianus M. Lafort, Delft (NL)

(73) Assignee: Sonionmicrotronic Nederland B.V., Amsterdam (NL)

( * ) Notice: Subject to any disclaimer, the term of this patent is extended or adjusted under 35 U.S.C. 154(b) by 744 days.

(21) Appl. No.: 10/125,245

(22) Filed: Apr. 18, 2002

(65) Prior Publication Data

US 2003/0199130 A1    Oct. 23, 2003

(51) Int. Cl.
*H04R 3/00* (2006.01)
(52) U.S. Cl. ........................... 381/122; 381/120
(58) Field of Classification Search ............... 381/120, 381/122; 330/277
See application file for complete search history.

(56) References Cited

U.S. PATENT DOCUMENTS

| | | | | |
|---|---|---|---|---|
| 4,748,445 A | * | 5/1988 | Togashi et al. | 345/91 |
| 5,097,224 A | | 3/1992 | Madaffari et al. | 330/277 |
| 5,446,413 A | | 8/1995 | Loeppert et al. | 330/277 |
| 5,675,290 A | | 10/1997 | Tsukahara et al. | 330/227 |
| 5,861,779 A | * | 1/1999 | Loeppert et al. | 330/277 |
| 6,031,268 A | * | 2/2000 | Hiroki et al. | 257/345 |
| 6,107,893 A | | 8/2000 | Forbes | 331/132 |
| 6,353,344 B1 | | 3/2002 | Lafort | 327/108 |

FOREIGN PATENT DOCUMENTS

| | | |
|---|---|---|
| EP | 0 670 602 B1 | 2/1995 |
| EP | 0880225 A2 | 4/1998 |
| JP | 08 182 092 | 7/1996 |
| WO | WO 96/10291 | 4/1996 |

OTHER PUBLICATIONS

European Search Report, dated Aug. 19, 2003.
"General Considerations of Noise in Microphone Preamplifiers," A.G.H. Van der Donk, J.A. Voorthuyzen and P. Bergveld, Sensors and Actuators A, 25-27 (1991), pp. 515-520.
"A Set of Four IC's in CMOS Technology for a Programmable Hearing Aid," Francois Callias, Francois H. Salchli, and Dominique Girard, IEEE Journal of Solid-State Circuits, vol. 24, No. 2, Apr. 1989, pp. 301-312.

* cited by examiner

*Primary Examiner*—Curtis Kuntz
*Assistant Examiner*—Alexander Jamal
(74) *Attorney, Agent, or Firm*—Jenkens & Gilchrist

(57) ABSTRACT

A high impedance circuit includes a diode-connected MOSFET circuit. This circuit may be used in a buffer amplifier of a hearing aid microphone, coupled across an input of the buffer amplifier and providing a high input impedance.

3 Claims, 6 Drawing Sheets

CMOS HIGH IMPEDANCE CIRCUIT

BACKGROUND OF THE INVENTION

This specification describes, with reference to the accompanying drawings, a novel and improved high impedance circuit. While this circuit may be used in any application requiring a high impedance, low noise circuit, the description below refers specifically to its use as an input bias circuit for a preamplifier circuit for a microphone component of a hearing aid.

Generally speaking, a hearing aid utilizes three basic components, a microphone, an amplifier and a receiver or loudspeaker component. Briefly, the microphone generally includes a transducer for converting incoming sound pressure levels to corresponding electrical signals. The amplifier amplifies these electrical signals to a desired level, and the receiver or loudspeaker component translates these amplified electrical signals to an acoustical sound output, or outgoing sound pressure level.

Generally, the microphone component includes a transducer such as an electret microphone, and a buffer amplifier or "preamplifier." Often, a CMOS amplifier component is used as the preamplifier. The input of this CMOS preamplifier must be biased to ground level. However, since the signal source in the electret microphone is typically a relatively small capacitor, the impedance of the preamplifier input should be relatively large, and preferably, as large as possible. Currently, bias resistor values of about 10 Gohms are utilized. For further noise reduction, this value might be increased up to 100 Gohms. However, these resistors cannot be implemented on ICs but must be made on a thick film hybrid. As an alternative to the resistors for the preamplifier input impedance, a pair of small diodes coupled in parallel but in opposite polarity (i.e., "antiparallel") are sometimes used. This permits a relatively large impedance value to be obtained, which value is strongly dependant upon process variations. However, the use of diodes for this purpose has the disadvantages of slow settling and slow overload recovery, which are characteristics of diodes.

In devices presently on the market, the bias voltage for the input of a preamplifier is supplied through a high-ohmic resistance or through a pair of anti-parallel diodes. In order to preserve the signal-to-noise ratio, the impedance of such device must be very high. On the other hand, the impedance has a certain maximum level, in order to enable a fast startup of the amplifier, and a fast recovery after overload. An integrated diode pair forms too high an impedance for guaranteeing stability; however, adding a parallel resistor (10–100 Gohms) introduces a level of noise.

OBJECTS AND SUMMARY OF THE INVENTION

Accordingly, it is an object of the invention to provide a high impedance circuit which overcomes the above-noted shortcomings of utilizing bias resistors or reverse-polarized parallel diodes.

In accordance with the foregoing, a high impedance input circuit for a buffer amplifier/preamplifier of a hearing aid microphone comprises a CMOS transistor circuit coupled across an input of said buffer amplifier/preamplifier and providing a high impedance.

In accordance with another aspect of the invention, a high impedance input circuit for a buffer amplifier/preamplifier of a hearing aid microphone comprises a diode-connected MOSFET circuit.

In accordance another aspect of the invention, a high impedance circuit comprises a CMOS transistor circuit providing a high impedance equivalent to a pair of antiparallel diodes.

In accordance with another aspect of the invention, a high impedance circuit comprises a diode-connected MOSFET circuit.

In accordance with another aspect of the invention, a method of constructing a high impedance circuit comprises forming on an integrated chip at least one p-channel transistor and at least one n-channel transistor coupled in circuit to provide a diode-switched high impedance.

DETAILED DESCRIPTION OF THE DRAWINGS

The Prior Art

Figure 1:
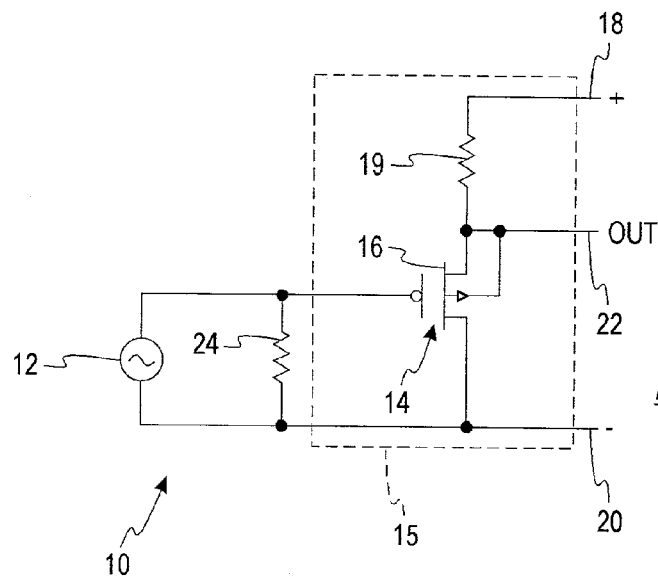
FIG. 1 is a schematic circuit diagram of a prior art microphone circuit for a hearing aid.

Referring initially to FIG. 1, a schematic circuit diagram of a microphone 10 for a hearing aid is designated generally by the reference numeral 10. The microphone includes a transducer component 12 such as an electret microphone which is symbolized in FIG. 1 as a current source. The microphone 10 also includes a buffer amplifier/preamplifier circuit portion 14 (hereinafter "preamplifier") which may comprise an MOS field effect transistor (FET) 16 wired in a common source configuration. A positive voltage 18 is provided with a suitable biasing resistor 19 for the transistor 16. A common or negative voltage connection 20 is also provided. The source electrode of the FET 16 provides the output 22 of the preamplifier 14. The preamplifier circuit 14 may be realized on a single integrated circuit (IC) chip 15.

The input of the preamplifier 14 for the microphone 10 must be biased to ground level. Since the signal source in the electret 12 is a very small capacitor, the impedance of the amplifier input must be as large as possible. Currently, a bias resistor 24 of about 10 Gohms is used. For reasons of noise reduction this value may be increased up to 100 Gohms. These resistors cannot be realized on IC's, therefore they are usually made on a thick film hybrid.

Figure 2:
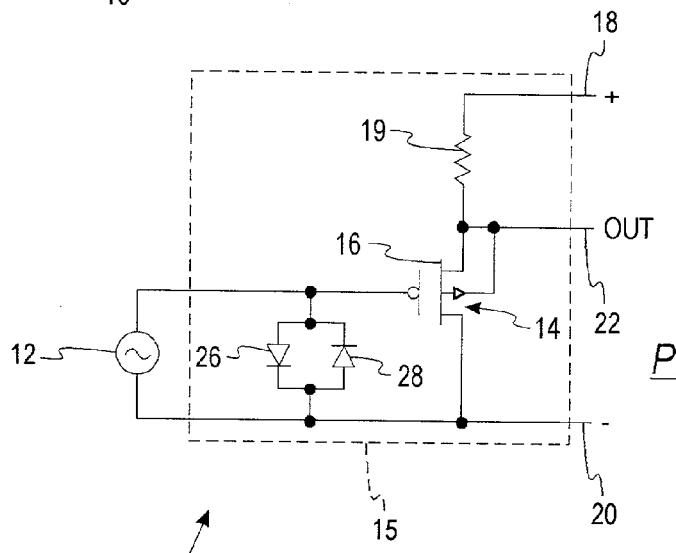
FIG. 2 is a schematic circuit diagram of an alternate form of prior art microphone circuit.

Referring to FIG. 2, a similar microphone 10 employing an electret transducer or microphone 12 and a preamplifier circuit 14, on an IC chip 15, is illustrated. Like reference numerals are utilized to designate like elements in FIG. 2.

In FIG. 2, the input impedance for the preamplifier 14 may be integrated onto the same chip 15 in the form of a pair of parallel diodes 26, 28 connected in reverse polarity. As indicated above, a relatively large impedance value can be obtained by the use of such diodes 26, 28, however, the value is strongly dependant on process variations. That is, it is difficult in the integrated circuit manufacture process to accurately predict the value of the impedance obtained by use of diodes 26, 28 within acceptable tolerance levels. The diodes 26, 28 also exhibit properties typical of diodes, in that they are relatively slow in settling of the voltage over the diode or reaching steady state conditions, exhibit relatively slow overload recovery times, and the like.

The Invention

Figure 3:
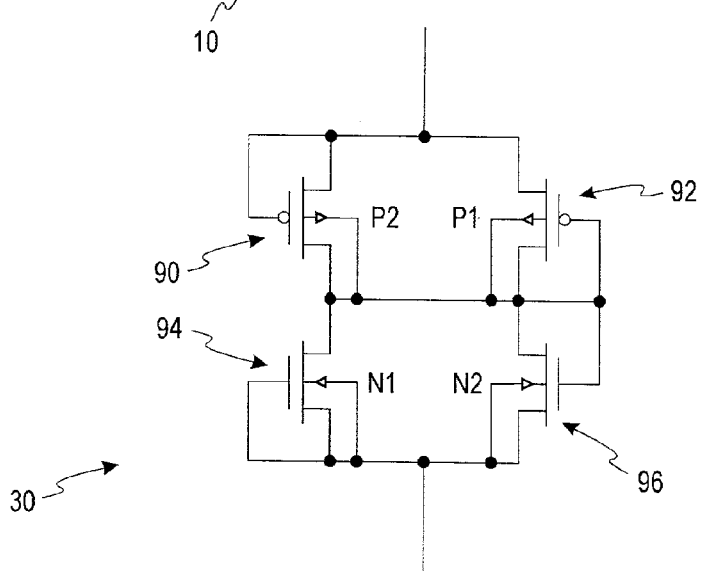
FIG. 3 is a schematic circuit diagram of a high input impedance device for a hearing aid microphone in accordance with the present invention.

Referring to FIG. 3, like reference numerals are again utilized to designate like elements and components. In accordance with the invention, the input impedance in FIG. 3 is provided by an additional CMOS transistor or MOSFET circuit 30.

The MOSFET circuit 30 is used as a high impedance transconductance. The MOS transistor circuit 30 may be integrated by CMOS technology onto the same chip 15 as the preamplifier circuit 14. Alternatively, the components of circuit 30 may be integrated on the same chip with the existing components of FIG. 2, with the circuit 30 in parallel with the diodes 26, 28. This approach affords some economy in that the entire chip does not have to be redesigned and refabricated. The specifications of the MOSFET circuit 30 are such that the influence of the diodes 26, 28 on its performance is negligible. Of course, the chip may be fabricated without the diodes 26, 28, if desired.

The MOSFET circuit 30 is designed so that the impedance is always higher than some selected minimum value, e.g. 50–100 Gohms, at the minimum control voltage.

In FIG. 3 "diode-connected" MOSFETs 90, 92, 94, 96 are used. Both p-channel 90, 92 and n-channel 94, 96 devices are used in the configuration shown in order to obtain symmetry. The circuit of four MOSFETS may be parallel with a diode pair 26, 28 of FIG. 2, as noted above.

Figure 4:
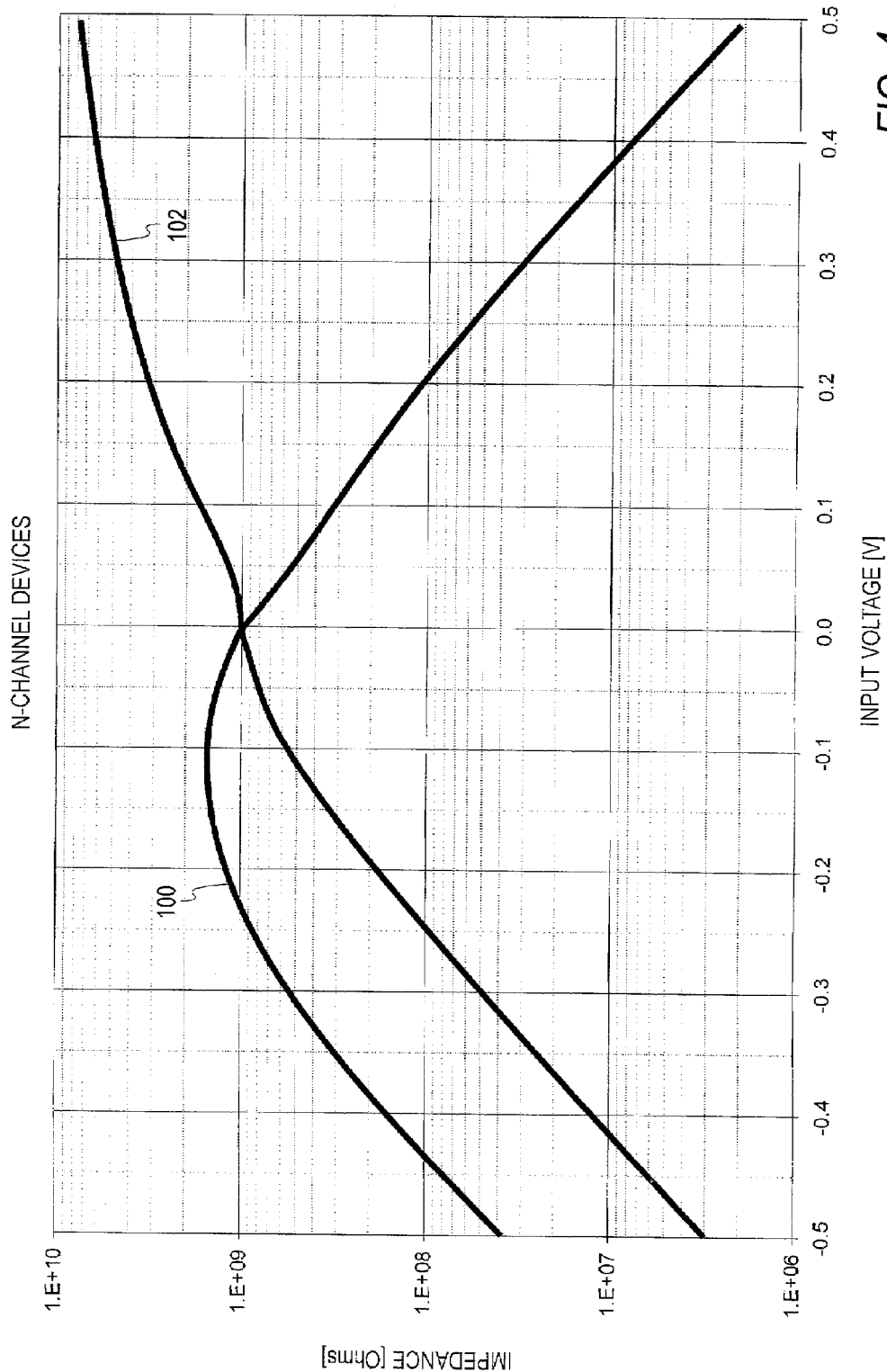
FIG. 4 is a graph showing the impedance of an n-channel device.

The graph of FIG. 4 shows the impedance curve of two ways to connect an n-channel device. The curve marked 100 is the impedance of the n-channel device 96 of FIG. 3, and the curve marked 102 is the impedance of the n-channel device 94 of FIG. 3. The bulk connections are all grounded. The impedance of the parallel connection of both n-channels devices (FIG. 6) is almost symmetrical for positive and negative input voltages.

Figure 5:
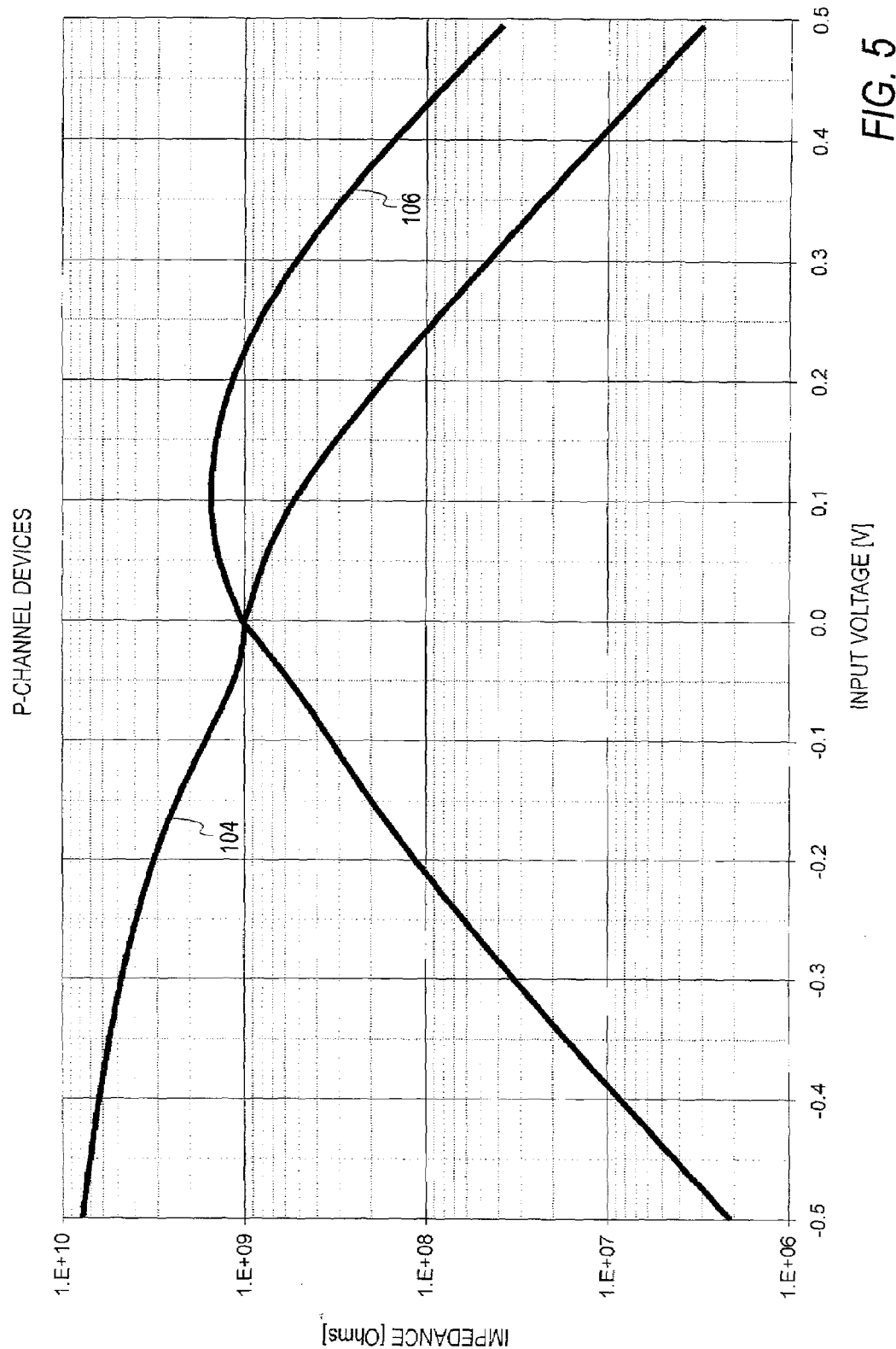
FIG. 5 is a graph showing the impedance of an p-channel device.

The graph of FIG. 5 shows the impedance curves of two ways to connect a p-channel device. The curve marked 104 is the impedance of the p-channel device 92 of FIG. 3, and the curve marked 106 is the impedance of the p-channel device 90 of FIG. 3. The impedance of the parallel connection of both p-channels devices (FIG. 7) is almost symmetrical for positive and negative input voltages, and is a mirror image compared with the n-channels graph of FIG. 6.

Figure 6:
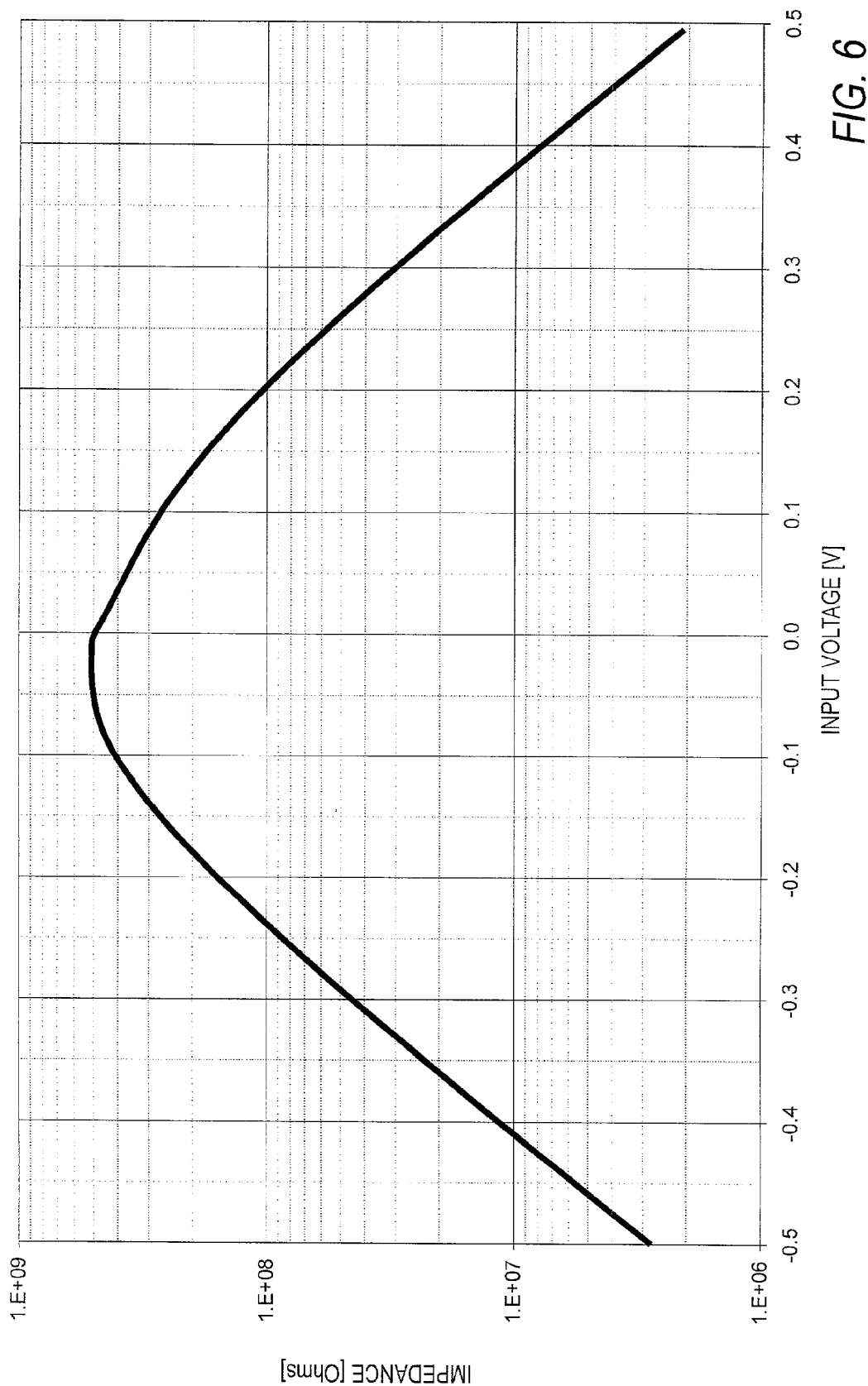
FIG. 6 is a graph showing the impedance of two n-channel devices in parallel.
Figure 7:
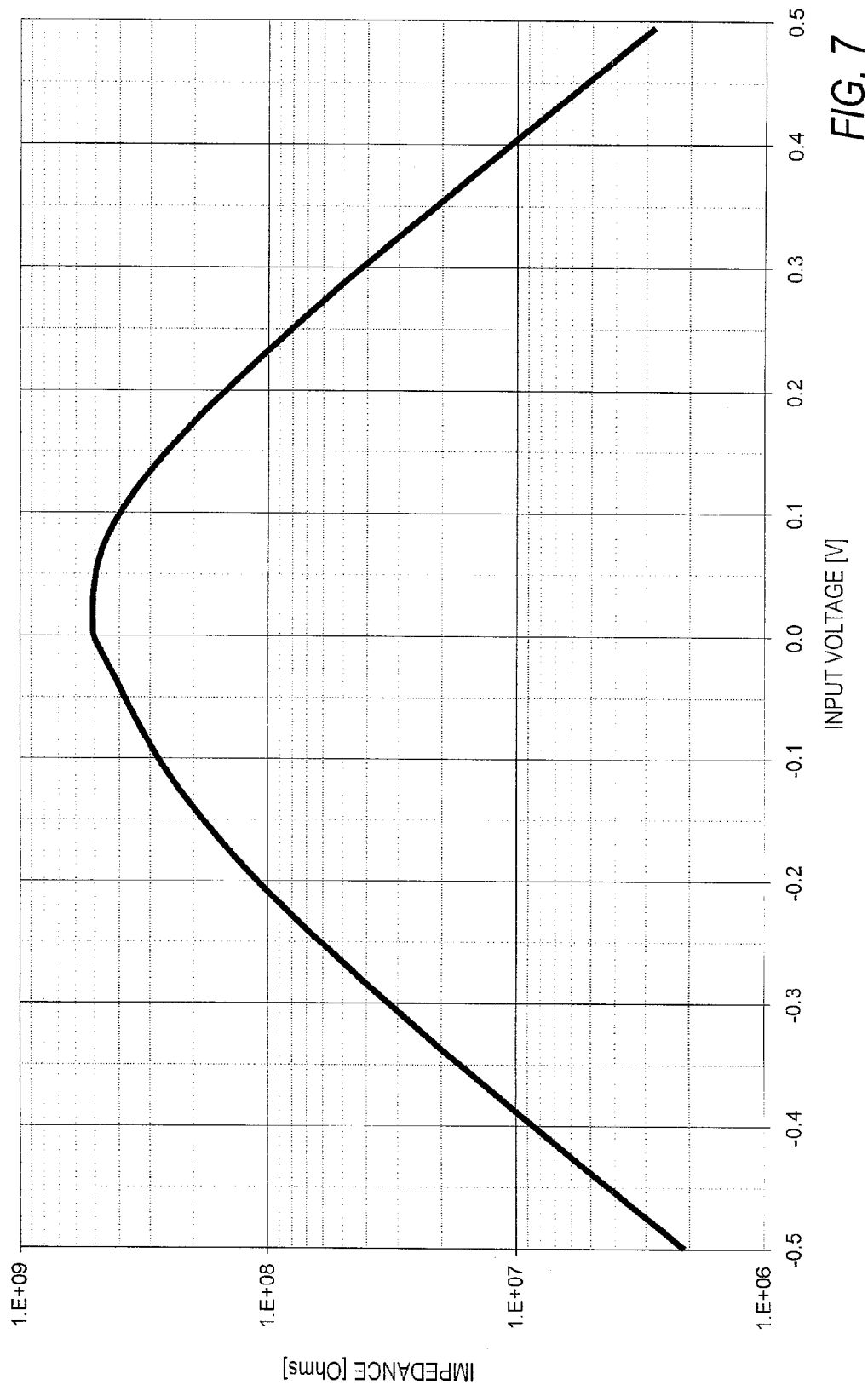
FIG. 7 is a graph showing the impedance of two p-channel devices in parallel.

The graphs for the p-channel devices (FIGS. 5 and 7) show the same behavior, and are mirror images compared with the n-channels graphs of FIGS. 4 and 6.

Figure 8:
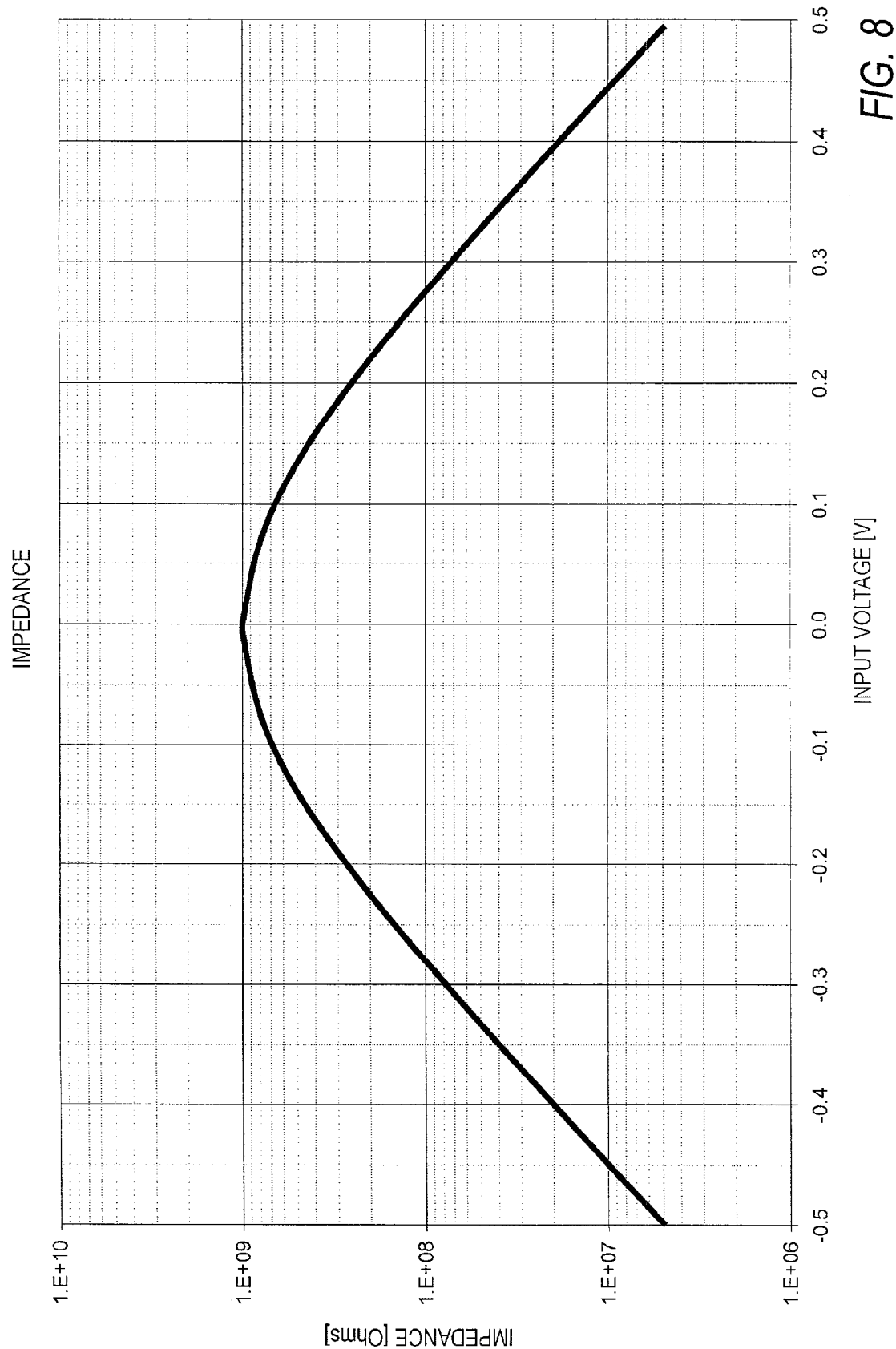
FIG. 8 is a graph showing the impedance of the circuit of FIG. 3.

The graph of FIG. 8 shows the impedance of the series connection of the n-channel pair and the p-channel pair of FIG. 3. This graph is symmetrical. The devices are scaled, so that the impedance at zero bias voltage is at the desired level. At this point, all devices contribute to the total impedance equally, so that the sensitivity of the impedance due to component variation is minimal.

The above-described high impedance bias circuit of the invention, as illustrated and described above with reference to FIGS. 3–8 offers a number of advantages over the prior art shown and described with reference to FIGS. 1 and 2.

Among other things, the circuitry of the invention can be integrated onto a common chip with the buffer amplifier/preamplifier circuitry. Unlike the diodes utilized in the embodiment of FIG. 2, the circuit of the invention is relatively insensitive to process variations in the IC manufacture process. The extremely high impedance which can be achieved by the circuitry of the invention minimizes the noise figure and optimizes signal to noise ratio of the microphone component including the electret 12 and preamplifier 14. Also, the controlled impedance of the invention further limits and minimizes input settling time of the buffer amplifier circuitry 14.

In one embodiment, the design is dimensioned, depending on the characteristics of the CMOS process, in such a way that the minimum impedance (i.e., with the minimum occurring threshold voltages) of the circuit is about 100 Gohms. The maximum impedance is about a factor of 10 higher.

Among the advantages of the above-described invention are: The impedance is more stable for process variations than the impedance of the anti-parallel diodes.

The circuit is much simpler and requires much less chip area than the advanced "high impedance bias device."

The additional parasitic capacitance is very small (since the sizes of the MOSFETs are very small, and only small diffusion areas are connected to the signal input).

The circuit can also be placed in parallel with the anti-parallel diodes (in order to cover a wider range of process variations).

The circuit is passive, no risk for oscillation and no battery/current consumption.

Linearity is very good for signals up to 300 mV amplitude.

While the CMOS high impedance circuit has been described above with reference to its use as a high input impedance bias circuit for a CMOS preamplifier, such as in a hearing aid, it has many other uses.

The above described CMOS high impedance circuit is a simple, very powerful passive circuit that can be applied everywhere there is a need for a high impedance, low noise circuit.

Examples of other applications include:

1. As a bias device in other stages of an amplifier, e.g., after a coupling capacitor.

2. As a bias device in other circuits that are connected to high impedance capacitive sensors, like Analog-to-Digital converters.

3. As a start-up device in, e.g., reference bias sources.

4. As a filtering device in filters that require large time constants.

While the present invention has been described with reference to one or more preferred embodiments, those skilled in the art will recognize that many changes may be made thereto without departing from the spirit and scope of the present invention which is set forth in the following claims.

What is claimed is:

1. A microphone, comprising:
   a transducing assembly for converting an input sound into an electrical signal;
   a buffer amplifier for amplifying said electrical signal and coupled to said transducing assembly; and
   a high input impedance input circuit connected to an input of said buffer amplifier, said high input impedance input circuit includes a substantially symmetrical high impedance, said high input impedance input circuit including first and second parallel circuit branches, said first branch including a diode-connected PMOS transistor in series with a diode connected NMOS transistor and said second branch including a diode-connected PMOS transistor in series with a diode-connected NMOS transistor, said buffer amplifier and said high input impedance input circuit being integrated by CMOS technology onto an integrated circuit chip.

2. The microphone of claim 1, wherein a common terminal between the diode-connected PMOS transistor and the diode-connected NMOS transistor of said first branch is connected to a common terminal between the diode-connected PMOS transistor and the diode-connected NMOS transistor of said second branch.

3. The microphone of claim 1, wherein said high impedance input circuit has an input impedance that is substantially symmetrical across a range of positive and negative bias voltages centered around zero volts.

* * * * *